(12) United States Patent
Bond et al.

(10) Patent No.: US 12,477,658 B2
(45) Date of Patent: Nov. 18, 2025

(54) ELECTRONIC CIRCUIT MANUFACTURING METHOD FOR SELF-ASSEMBLY TO ANOTHER ELECTRONIC CIRCUIT

(71) Applicant: Commissariat à l'Énergie Atomique et aux Énergies Alternatives, Paris (FR)

(72) Inventors: Alice Bond, Grenoble (FR); Emilie Bourjot, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 500 days.

(21) Appl. No.: 17/895,263

(22) Filed: Aug. 25, 2022

(65) Prior Publication Data

US 2023/0061111 A1 Mar. 2, 2023

(30) Foreign Application Priority Data

Aug. 27, 2021 (FR) ...................................... 2108992

(51) Int. Cl.
*H05K 3/10* (2006.01)
*H05K 3/26* (2006.01)

(52) U.S. Cl.
CPC ............... *H05K 3/107* (2013.01); *H05K 3/26* (2013.01)

(58) Field of Classification Search
CPC .. H05K 3/107; H05K 3/26; H01L 2224/0361; H01L 2224/05624; H01L 2224/08145;

(Continued)

(56) References Cited

U.S. PATENT DOCUMENTS 9,240,389 B2 1/2016 Di Cioccio et al.
9,522,450 B2 12/2016 Berthier et al.
(Continued)

FOREIGN PATENT DOCUMENTS

FR 3 058 258 A1 5/2018
WO WO 2018/034746 A1 2/2018

OTHER PUBLICATIONS

Preliminary Search Report for French Application No. 2108992, dated May 2, 2022.
(Continued)

*Primary Examiner* — Duy Vu N Deo
(74) *Attorney, Agent, or Firm* — Wolf, Greenfield & Sacks, P.C.

(57) ABSTRACT

The present description relates to a method of manufacturing an electronic circuit (30) comprising:
a support (32),
an assembly site (31) having a first surface protruding from said support intended to be assembled to an assembly site of another electronic circuit by a self-assembly method; and
a peripheral area (39) around said assembly site,
the assembly site (31) comprising at least one level, each level comprising conductive pads (34) and insulating posts (380) between the conductive pads,
said manufacturing method comprising the forming of said at least one level of the assembly site, such that the edges, in at least one direction (X) of the main plane (XY), of each level of the assembly site and the locations, in the at least one direction (X), of the conductive pads and of the insulating posts of the same level are defined in a same photolithography step of said method.

15 Claims, 8 Drawing Sheets

(58) Field of Classification Search
CPC .................. H01L 25/50; H01L 24/05; H01L 2224/05638; H01L 2224/05647; H01L 2224/05657; H01L 2224/05684; H01L 2224/80004; H01L 2224/80143; H01L 2224/80203; H01L 2224/80357; H01L 2224/80895; H01L 24/80; H01L 24/03; H01L 2224/0348; H01L 2224/03622; H01L 2224/03845; H01L 2224/0391; H01L 2224/80365; H01L 2224/80896; H01L 2224/94
USPC .......................................................... 216/18
See application file for complete search history.

(56) References Cited

U.S. PATENT DOCUMENTS

| | | |
|---|---|---|
| 9,586,207 B2 | 3/2017 | Mermoz et al. |
| 10,438,921 B2 | 10/2019 | Fournel et al. |
| 11,121,117 B2 | 9/2021 | Di Cioccio |
| 11,380,648 B2 | 7/2022 | Di Cioccio et al. |
| 11,678,484 B2 * | 6/2023 | Tsai .................. H10B 41/30 257/321 |
| 2006/0292795 A1 * | 12/2006 | Kwon ................ H10D 30/0411 438/257 |
| 2010/0248424 A1 | 9/2010 | Luce et al. |
| 2013/0105981 A1 | 5/2013 | Cooney, III et al. |
| 2020/0111763 A1 | 4/2020 | Hong et al. |
| 2020/0365540 A1 | 11/2020 | Jouve et al. |

OTHER PUBLICATIONS

Mastrangeli et al., Surface tension-driven self-alignment. Soft Matter. 2017;13(2):304-27.

Mermoz et al., High density chip-to-wafer integration using self-assembly: on the performances of directly interconnected structures made by direct copper/oxyde bonding. 2013 IEEE 15th Electronics Packaging Technology Conference (EPTC 2013). Dec. 11, 2013:162-7.

* cited by examiner

ELECTRONIC CIRCUIT MANUFACTURING METHOD FOR SELF-ASSEMBLY TO ANOTHER ELECTRONIC CIRCUIT

TECHNICAL BACKGROUND

The present disclosure generally relates to the three-dimensional integration of microelectronic components, and relates more particularly to the manufacturing of electronic circuits capable of being assembled on each other by a self-assembly method.

PRIOR ART

To perform the three-dimensional integration of microelectronic components, there exist a plurality of techniques, and particularly the approach called "die-to-wafer". This technique aims at using the functional dies of a wafer and at transferring them, after dicing, onto another wafer that may also be previously functionalized, that is, prepared for its assembly with the die.

The alignment of dies on a wafer may be obtained with robotized machines allowing the sampling and the positioning of the dies, one by one, for their assembly on the wafer. This technique and the associated machines are known under terminology "pick-and-place". However, due the decrease of dimensions in three-dimensional integration, inducing an increase in the requirement for the accuracy of alignment between the die and the wafer (for example, alignment error smaller than 1 µm, or even than 0.5 µm), combined with the assembly rate requirements (for example, greater than 10,000 dies per hour), this technique becomes less and less adapted. Further, its implementation implies the use of machines which are generally expensive and complex.

Self-assembly techniques are more and more envisaged as alternatives or as a complement to robotics, and particularly to the pick-and-place technique.

A known self-assembly method, enabling to align and then to assemble an electronic circuit on a support, comprises using a fluid as a self-alignment medium, particularly a liquid drop.

The electronic circuit to be assembled may be a die (or chip) and correspond to an integrated circuit. The support generally corresponds to another electronic circuit, which may be an integrated circuit die or an integrated circuit wafer, which may be designated as a short-cut with the term "wafer".

A method of self-assembly of an electronic circuit on a support may be based on the confinement of a drop of a liquid, for example, water, on a surface having a high wettability (which can be designated as a hydrophilic surface) located on the support and corresponding to the desired location of the electronic circuit. The electronic circuit may then be arranged on the liquid drop, which enables to align it with respect to its location on the support.

The high-wettability surface may be surrounded with a surface having a low wettability (which can be designated as a "hydrophobic" surface), to favor the confinement of the liquid drop on the hydrophilic surface. The wettability of a material may be characterized by the contact angle θ (visible in FIG. 1) of a liquid drop on the material (angle θ is visible in FIG. 1). The smaller the contact angle, the higher the wettability of the material.

FIG. 1 shows an example of support 100 and of electronic circuit 200 adapted to being assembled to each other by a self-assembly method.

Support 100 has on its upper surface 100A an assembly site 110 of high wettability surrounded with a peripheral area 190 of low wettability. For example, the edges 110A, 110B of assembly site 110 form a step with respect to peripheral area 190. Assembly site 110 forms a protrusion on a substrate 120 and comprises a plurality of conductive pads 140 flush with the surface and separated by insulating posts 130.

In the same way as support 100, electronic circuit 200 comprises at the level of its front surface 200A, which corresponds to the surface intended to be fastened to the upper surface 100A of support 100, a protruding assembly site 210, having its dimensions substantially corresponding to those of the assembly site 110 of the support. Assembly site 210 is surrounded with a peripheral area 290 of low wettability. For example, the edges 210A, 210B of assembly site 210 form a step with respect to peripheral area 290, which may also correspond to the edges of electronic circuit 200. In the same way as for support 100, the assembly site is arranged on a substrate 220 and comprises conductive pads 240 flush with the surface and separated by insulating posts 230.

To assemble electronic circuit 200 to support 100, a drop G of a liquid, for example, water, is arranged on the assembly site 110 of the support. Electronic circuit 200 is then brought towards assembly site 110 until its assembly site 210 comes into contact with the drop. In this approach phase, the electronic circuit may be offset, or even inclined with respect to the assembly area. The forces exerted by the drop on the electronic circuit then displace electronic circuit 200 all the way to the desired alignment relative to the assembly site 110, generally without for any external action to be necessary. Once the electronic circuit is aligned on the support, a step of bonding of the electronic circuit to the support may be implemented, after evaporation of the liquid. By convention, it is considered that the bonding step is a step comprised in the self-assembly method.

For certain applications, the bonding step may comprise or consist of a step of thermocompression or of molecular bonding. Molecular bonding (or "direct bonding") is induced by all the electronic interaction attractive forces between the atoms or molecules of the two surfaces to be bonded and thus enables to fasten the two surfaces via a direct bringing into contact without using a bonding material.

In particular, it is desired to perform a hybrid bonding step in a self-assembly method, enabling to assemble an electronic circuit on a support, while ensuring an electric interconnection between the electronic circuit and the support. As a short-cut, it may be spoken, in all the present disclosure, of a hybrid self-assembly method. In particular, the bonding step may comprise or consist of a hybrid molecular bonding step.

In the shown example, a hybrid self-assembly method must enable to bond electronic circuit 200 to support 100 by aligning not only assembly sites 110, 210 with respect to each other, but also to bring into contact the conductive pads 240 of electronic circuit 200 with the conductive pads 140 of support 100.

However, with known self-assembly methods, it may be difficult to perform a correct alignment of the assembly sites, while respecting the alignment of the conductive pads. This alignment requirement is even more crucial when the pitches between conductive pads decrease and/or the width of the conductive pads decreases.

There thus exists the need for a solution enabling to self-assemble an electronic circuit on another electronic circuit, which allows the alignment of the electronic circuits with respect to each other while ensuring the alignment of conductive pads of the electronic circuit with those of the other electronic circuit, and this, whatever the pitches between conductive pads and/or the widths of said conductive pads.

It is further desirable for the solution to be compatible with conventional electronic circuit manufacturing and/or assembly techniques.

SUMMARY OF THE INVENTION

An object of an embodiment is to overcome all or part of the disadvantages of known self-assembly solutions, by providing a method of manufacturing an electronic circuit adapted to being assembled by a self-assembly method with a hybrid bonding to another electronic circuit.

An embodiment provides a method of manufacturing an electronic circuit extending along a main plane and comprising:
  a support,
  an assembly site on said support, said assembly site having a first surface protruding from said support intended to be assembled to an assembly site of another electronic circuit by a self-assembly method, and
  a peripheral area around said assembly site;
the assembly site comprising at least one level, each level comprising conductive pads and insulating posts between the conductive pads, said conductive pads and said insulating posts being flush with said first surface of said assembly site;
  said manufacturing method comprising the forming of said at least one level of the assembly site, such that the edges, in at least one direction of the main plane, of each level of the assembly site and the locations, in the at least one direction, of the conductive pads and of the insulating posts of the same level are defined in a same photolithography step of said method;
  said photolithography step being adapted to forming a resin pattern sized to form, after a step of etching from a surface of a structure covered with said pattern, said edges and said locations.

According to an embodiment, the manufacturing method comprises, for each level of the assembly site, an etch step, subsequent to the photolithography step, said etch step being carried out from the surface of the structure covered with the resin pattern forming an etching mask.

According to an embodiment, the resin pattern formed for each level of the assembly site is sized so that the insulating posts comprise insulating posts at the edges of the assembly site wider in the at least one direction of the main plane than the insulating posts located between said edges.

According to an embodiment, the resin pattern formed for at least the first level of the assembly site is sized to form on the peripheral area of the support complementary posts in the insulating layer.

According to a specific embodiment, the complementary posts are configured to decrease the wettability of the peripheral area with respect to the wettability of the assembly site. For example, the complementary posts have a width in a direction of the main plane in the range from 0.5 µm to 1 µm, a height in the range from 50 nm to 2 µm and two adjacent complementary pads are distant by a spacing in the range from 0.5 µm to 2 µm in said direction.

According to an embodiment, the forming of a first level of the assembly site comprises:
  a step of forming an insulating layer made of a first dielectric material on the support; then
  a photolithography step adapted to forming a resin pattern on the insulating layer; then
  a step of etching from the surface of the insulating layer covered with the pattern forming an etching mask, to form a plurality of trenches in said insulating layer separated from one another by insulating posts made of the first dielectric material; then
  a step of removal of the pattern; then
  a step of forming a conductive layer made of a first conductive material on the etched surface of the insulating layer to at least fill the trenches, the first conductive material inserted into the trenches forming conductive pads separated from one another by the insulating posts; then
  a step of polishing, for example, chemical-mechanical, of the conductive layer, said polishing step being adapted to having the conductive pads flush with, and at the same level as, the insulating posts of the etched insulating layer.

The first conductive material is for example copper or cobalt.

According to an embodiment, the forming of a first level of the assembly site comprises:
  a step of forming a conductive layer made of a second conductive material on the support; then
  a photolithography step adapted to form a resin pattern on the conductive layer; then
  a step of etching from the surface of the conductive layer covered with the pattern forming an etching mask, to form a plurality of trenches in the conductive layer and conductive pads made of the second conductive material separated from one another by said trenches; then
  a step of removal of the pattern; then
  a step of forming an insulating layer made of a second dielectric material on the etched surface of the conductive layer to at least fill the trenches, the second dielectric material inserted into said trenches forming insulating posts insulating the conductive pads from one another; then
  a step of polishing, for example, chemical-mechanical, of the insulating layer, said polishing step being adapted such that the insulating posts are flush with each other at the level of the conductive pads.

The second conductive material is for example aluminum, tungsten, or an alloy based on aluminum and copper or on aluminum and silicon.

According to an embodiment, the forming of the first level of the assembly site comprises, prior to the step of forming the insulating layer made of the first dielectric material or of the conductive layer made of the second conductive material, a step of forming an etch stop layer on the support, for example, a silicon nitride layer.

According to an embodiment, the steps of forming the first level of the assembly site are repeated at least once to form another assembly site level comprising other conductive pads and other insulating posts, said other conductive pads, respectively said other insulating posts, being arranged vertically in line with the conductive pads, respectively with the insulating posts, of the previously-formed level of the assembly site. According to an example, said method comprises a prior step of forming an etch stop layer on the previously-formed level of the assembly site.

According to an embodiment, the manufacturing method comprises a complementary photolithography step adapted to covering the assembly site with a complementary resin pattern, said complementary pattern further extending by a dimension for example in the range from 1 nm to 1 µm, for example, 300 nm, on either side of said assembly site above the peripheral area.

According to a specific embodiment, the manufacturing method comprises, subsequently to the complementary photolithography step, a complementary step of etching, preferably wet, of a portion of the at least one conductive layer located on the peripheral area.

According to a specific embodiment, the manufacturing method comprises a step, subsequent to the complementary photolithography step and, if present, to the complementary etch step, of forming a layer, having a thickness for example in the range from 1 to 300 nm, made of a hydrophobic material on the peripheral area, the hydrophobic material being for example a fluorinated material, preferably fluorocarbon.

An embodiment provides an electronic circuit extending along a main plane and comprising:
 a support;
 an assembly site on said support, said assembly site having a first surface protruding from said support intended to be assembled to an assembly site of another electronic circuit by a self-assembly method; and
 a peripheral area surrounding said assembly site;
the assembly site comprising at least one level, each level comprising conductive pads and insulating posts between the conductive pads, said conductive pads and said insulating posts being flush with said first surface of said assembly site;
 the edges, in at least one direction of the main plane, of each level of the assembly site and the locations, in the at least one direction, of the conductive pads and of the insulating posts of the same level being defined in a same photolithography step, adapted to forming a resin pattern sized to form, after a step of etching from a surface of a structure covered with said pattern, said edges and said locations;
 the edges of the assembly site, in the at least one direction of the main plane, comprising insulating posts.

An embodiment provides a method of self-assembly of a first electronic circuit and of a second electronic circuit, the first and second electronic circuits being manufactured by the manufacturing method according to an embodiment, the self-assembly method comprising:
 a step of deposition of a drop of a liquid on the first surface of the assembly site of the first electronic circuit; then
 the bringing into contact of the first surface of the assembly site of the second electronic circuit with the first surface of the assembly site, coated with the liquid drop, of the first electronic circuit; then
 a step of bonding, for example by hybrid molecular bonding or thermocompression, of the assembly site of the second electronic circuit to the assembly site of the first electronic circuit.

According to an embodiment, the second electronic circuit is diced to form an integrated circuit die, prior to the step of bringing into contact, the first electronic circuit being an integrated circuit wafer.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DESCRIPTION OF THE EMBODIMENTS

Figure 1:
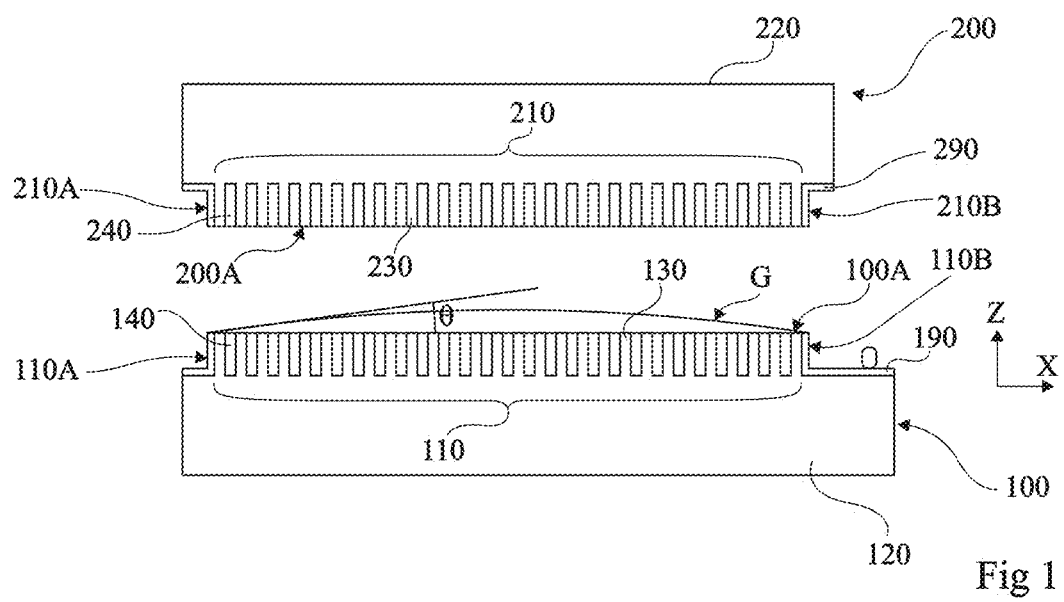
FIG. 1 shows an example of an electronic circuit and of a support intended to be assembled by a self-assembly method.

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

In particular, the portion of each electronic circuit, called back end of line (BEOL), corresponding to the portion where the components of the electronic circuit are interconnected together and/or may be interconnected to another electronic circuit, due to one or a plurality of metallization levels, has essentially been shown. The BEOL of an electronic circuit generally comprises at least one insulating layer having metal tracks of one or a plurality of metallization levels formed therein and conductive vias for coupling the electronic components together (not shown in the drawings), as well as conductive connection pads adapted to coupling the electronic circuit to another electronic circuit. Under the BEOL, the electronic circuit generally comprises at least one substrate inside and/or on top of which are formed electronic components, which are not shown in the drawings.

Further, certain steps of the manufacturing method (for example, layer forming steps, photolithography steps, resin removal steps, etch steps . . . ) are not detailed, these steps being within the abilities of those skilled in the art who can implement current electronic circuit manufacturing techniques.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings or to an electronic circuit, considering that the BEOL is in the upper portion.

All along the present description, a height as well as a thickness designate a dimension along a vertical direction (Z direction identified in the drawings), a width designates a dimension along the X direction identified in the drawings. A pitch, or a spacing, designates in the drawings a dimension along the X direction. A pitch, or a spacing, may also correspond to a dimension along the Y direction perpendicular to the X and Z directions. The X and Y directions form an XY plane designated as being the main plane of an integrated circuit.

Unless specified otherwise, the expressions "around", "approximately", "substantially" and "in the order of" signify within 10%, and preferably within 5%.

All along the present disclosure, a "hydrophilic" material designates a material having a high wettability, and a "hydrophobic" material designates a material having a low wettability. Generally, the wettability of a material may be characterized by the static contact angle of a liquid drop on the material. The smaller the contact angle, the higher the wettability of the material. It can be considered that a material of high wettability is material for which the static contact angle of a drop of the liquid is smaller than 90° and that a material of low wettability is a material for which the static contact angle of a drop of the liquid is greater than 90°. The measurement of the wetting angle may be performed by using the measurement device commercialized by GBX under trade name Digidrop-MCAT.

A damascene method comprises the provision of openings in a continuous layer of a first material and then a step of deposition of a second material to fill these openings, and then a step of polishing (planarization) of the surface to form a substantially planar surface where the first and second materials are flush with each other.

FIGS. 2A to 2D show steps of a method of self-assembly of an electronic circuit, for example, a die, on another electronic circuit, for example, a wafer.

Figure 2A:
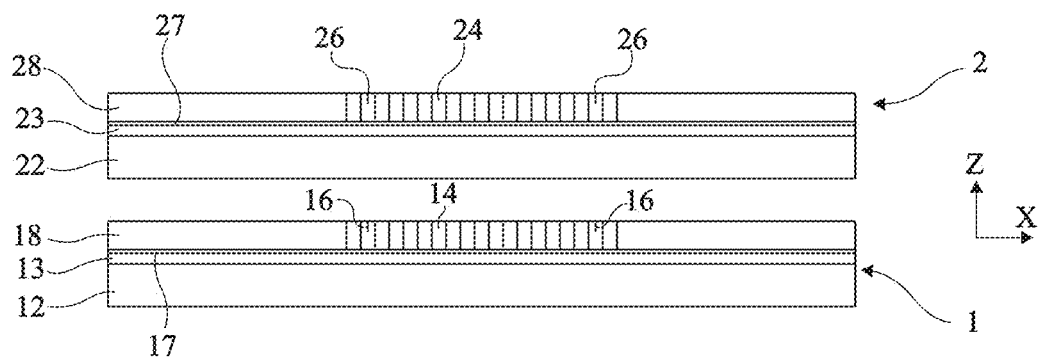
FIG. 2A, FIG. 2B, FIG. 2C, and FIG. 2D are cross-section views illustrating a method of self-assembly of an electronic circuit on a support.

FIG. 2A shows two electronic circuits 1, 2, which may be integrated circuit wafers. Each shown electronic circuit 1, 2 comprises a substrate 12, 22, for example, made of silicon (Si), having at least one first layer 13, 23 made of a dielectric material, for example, silicon dioxide ($SiO_2$), arranged thereon. An etch stop layer 17, 27, for example, made of silicon nitride ($Si_xN_y$), is arranged on the first dielectric material layer 13, 23. A second layer 18, 28 made of a dielectric material, for example, of silicon dioxide ($SiO_2$), is arranged on stop layer 17, 27. A plurality of conductive pads 14, 24 extend substantially vertically in second dielectric material layer 18, 28 all the way to etch stop layer 17, 27 and are flush with the upper surface of said second layer. Thus, two adjacent conductive pads 14, 24 are separated by the dielectric material of second layer 18, 28.

In FIG. 2A, the widths of conductive pads 14, 24 are substantially all equal and the spacings between two adjacent pads are substantially all equal. It is however possible to have, on a same assembly site, different areas, each having a specific conductive pad size and spacing between pads. It is then spoken of a "multi pitch".

Alignment marks 16, 26 have been formed in each of the two electronic circuits 1, 2. Marks 16, 26 are for example positioned in the second dielectric layer 18, 28 of each electronic circuit, between two conductive pads 14, 24. Alignment marks 16, 26 are positioned symmetrically between the first and the second electronic circuit.

The shown conductive pads 14, 24 are for example made of copper (Cu). They may be formed by a damascene method, comprising a step of etching of the second dielectric layer down to the etch stop layer to form trenches and/or holes in said second layer, generally preceded by a photolithography step to define a resin pattern forming an etching mask, then a copper deposition step to fill the trenches and/or the holes, and then a step of polishing (or "planarization") of the upper surface of the electronic circuit so that the conductive pads are flush with, and at the same level as, the upper surface of the second dielectric layer.

Figure 2B:
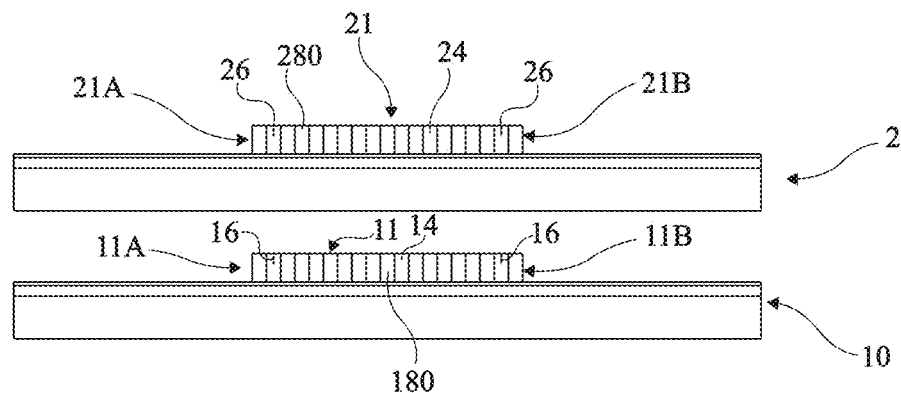

FIG. 2B shows a next step where the second dielectric layer 18, 28 of each electronic circuit 1, 2 has been etched on either side of the series of conductive pads 14, 24 to form an assembly site 11, 21 integrating said conductive pads. Of the second dielectric layer, there only remain dielectric posts 180, 280 arranged between two conductive pads 14, 24, or against a single conductive pad. This etch step is generally preceded by a photolithography step to define the positioning and the dimensions of the etching, and thus the positioning and the dimensions of the assembly site. For example, the dimensions, and particularly the widths, of the two assembly sites 11, 21 are substantially equal to one another.

The first electronic circuit thus prepared may form a wafer 10 functionalized for a method of self-assembly with a die 20.

After step 2B, second electronic circuit 2 is diced to form a die 20, after which the latter is flipped so that it can be aligned and then assembled to wafer 10.

Figure 2C:
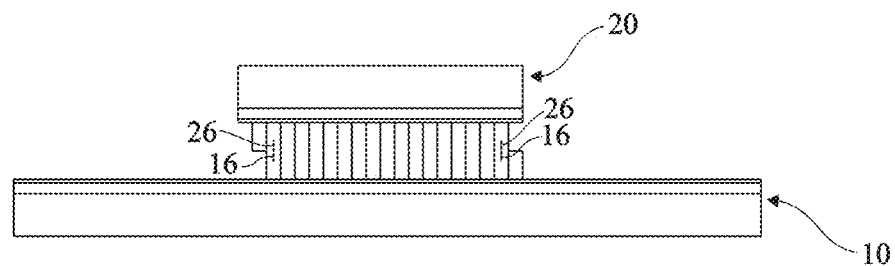

A solution, shown in FIG. 2C, to align die 20 with wafer 10, generally used in the pick-and-place technique, is to control the alignment of the marks 26 of die 20 with respect to the marks 16 of wafer 10 by means of a camera to enable to align the conductive pads 14 of wafer 10 with the conductive pads 24 of die 20. This solution may generate an offset between the assembly site 11 of wafer 10 and the assembly site 21 of die 20, as can be seen in FIG. 2C. Such a solution is not implementable in a self-assembly method.

Figure 2D:
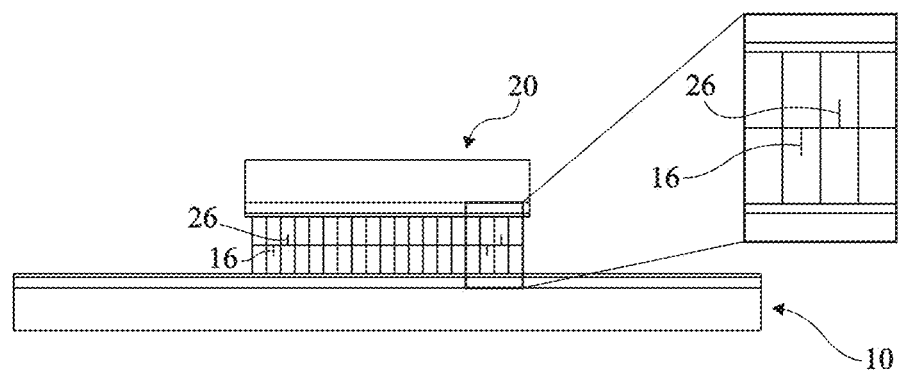

Another solution, shown in FIG. 2D, more adapted to a self-assembly method, is to align the edges 11A, 11B of the assembly site 11 of wafer 10 with the edges 21A, 21B of the assembly site 21 of die 20. However, this solution may result in a misalignment between the conductive pads 14 of wafer 10 and the conductive pads 24 of die 20, as can be seen in FIG. 2D. With such a misalignment of the conductive pads, the interconnection between the die and the wafer once assembled may not be ensured.

This misalignment is due to the fact that each assembly site with conductive pads is formed by means of two photolithography/etching levels, as explained hereafter: a first level to form the conductive pads and a second level to form the assembly site. Now, during the method of manufacturing of the assembly site, and in particular due to the two photolithography/etching levels, a misalignment may occur in the X direction (and/or in the Y direction), particularly due to transformations of the underlying layers. Such a misalignment between two photolithography levels may reach approximately 250 nm for an electronic circuit, 500 nm when two electronic circuits are stacked. This induces a technological limit to the width decrease of the conductive pads and of the interconnection pitch (spacing between two conductive pads).

The inventors have provided a method of manufacturing an electronic circuit intended to be assembled to another electronic circuit by a self-assembly method, enabling to overcome all or part of the above-mentioned disadvantages.

Examples of implementation of manufacturing methods will be described hereafter. These examples are non-limiting and various alterations will occur to those skilled in the art based on the indications of the present disclosure.

FIGS. 3A to 3F are cross-section views illustrating a method of manufacturing, implementing a damascene method, an electronic circuit 30 intended to be assembled by a self-assembly method to another electronic circuit obtained by a manufacturing method according to an, preferably the same, embodiment.

Figure 3A:
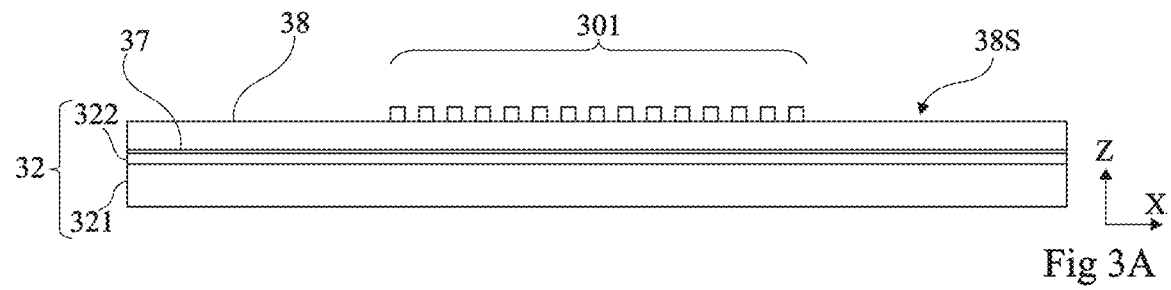
FIG. 3A, FIG. 3B, FIG. 3C, FIG. 3D, FIG. 3E, and FIG. 3F are cross-section views illustrating a method of manufacturing an electronic circuit according to an embodiment.

FIG. 3A illustrates an initial structure 32 (support). It comprises a substrate 321 coated with an initial layer made of a dielectric material 322 having a thickness typically in the range from approximately 50 nm to 2 μm, for example, equal to approximately 500 nm. The substrate is for example made of silicon (Si) with a thickness in the range from approximately 300 μm to 2,000 μm, for example, equal to approximately 725 The dielectric material of the initial layer is for example made of silicon dioxide ($SiO_2$).

All along the disclosure, a layer made of a dielectric material may also be designated as "insulating layer". An insulating layer may be a monolayer or have a multilayer structure comprising a stack of insulating layers.

The initial dielectric material layer 322 is covered with an etch stop layer 37, for example made of silicon nitride ($Si_xN_y$). Its thickness is for example in the range from approximately 5 to 300 nm, for example equal to approximately 70 nm.

Etch stop layer 37 is covered with a layer 38 of a dielectric material, for example, of silicon dioxide ($SiO_2$) and having a thickness typically in the range from approximately 100 nm to 2 μm for example equal to approximately 500 nm.

There is formed, in this example by photolithography, on insulating layer 38 a resin pattern 301 formed of a succession of solid square blocks (solid portions) separated by holes.

Figure 3B:
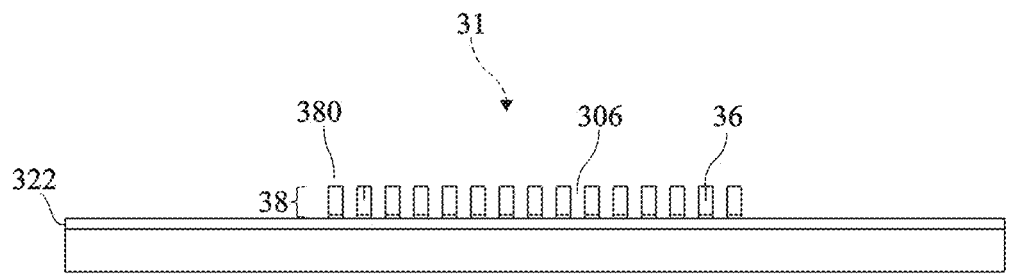

FIG. 3B illustrates the structure obtained after etching of insulating layer 38 through a first etching mask formed by pattern 301 with a stop on etch stop layer 37, removal of pattern 301, and then etching of etch stop layer 37 through the etched insulating layer 38.

A plurality of posts 380 made of a dielectric material (corresponding to the square blocks of the pattern) and of trenches 306 between said posts (corresponding to the holes of the pattern) is thus obtained. The contours of pattern 301, as well as some insulating posts among the plurality of insulating posts 380, define the contours (edges) of the future assembly site 31 (indicated in dotted lines in FIG. 3B since not completed at this step of the method) of the electronic circuit, as well as the locations of the future conductive pads 34 which will be formed in trenches 306.

Thus, the edges of the assembly site and the locations of the conductive pads in said assembly site (the term "locations" including dimensions in at least one direction of main plane XY) are defined during this photolithography step, that is, with a same photolithography level. The edges and the locations are defined in at least the X direction of main plane XY, but may also be defined in the Y direction of the main plane.

Optionally, alignment marks 36 are formed in one or a plurality of insulating posts 380.

Figure 3C:
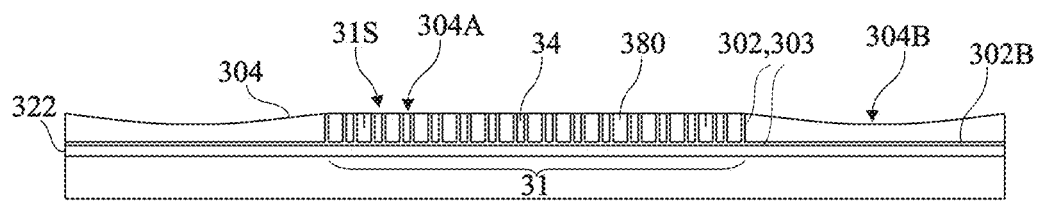

FIG. 3C illustrates the forming of conductive pads 34 at the level of trenches 306.

For this purpose, a barrier layer 302 is formed on insulating posts 380 and the non-covered portions of initial insulating layer 322; then a seed layer 303 made of a metallic material is formed on this barrier layer.

Barrier layer 302 comprises a material adapted to blocking the diffusion of metallic and/or conductive material into the dielectric material, for example, titanium nitride (TiN), possibly used as a bilayer with titanium (TiN/Ti) or a bilayer of tantalum nitride and of tantalum (TaN/Ta). Its thickness is for example in the range from approximately 5 to 300 nm, for example equal to approximately 10 nm.

Seed layer 303 corresponds to an initiation layer allowing the subsequent growth of a conductive layer by electrochemistry. It is for example made of copper, enabling to obtain a copper conductive layer by electrochemistry. Its thickness is for example in the range from approximately 1 nm to 300 nm, for example, equal to approximately 90 nm.

A conductive layer 304 made of a conductive material, for example, metallic, for example, copper, is then grown by electrochemistry from seed layer 303. Conductive layer 304 for example has a thickness in the range from 100 nm to 3 μm, for example, equal to 1 μm. The conductive material of layer 304 particularly fills trenches 306.

As a variant, conductive layer 304 may be made of another metal, for example, cobalt (Co) or of a metal alloy. The material of the seed layer is then adapted to obtaining the desired conductive layer.

The obtained structure is then polished ("planarized") to remove an excess portion of conductive layer 304 to define a planar surface where the conductive material in trenches 306 is flush with insulating posts 380. The conductive material in trenches 306 defines conductive pads 34. Further, the polishing step may advantageously suppress a portion of the layer of barrier material 302 located on the insulating posts. The polishing step for example is a chemical mechanical polishing ("CMP").

At the end of the polishing step, a first portion 304A of the conductive layer forms conductive pads 34 between insulating posts 380, two conductive pads being thus electrically insulated, and a second portion 304B of the conductive layer extends on either side of the alternation of conductive pads 34 and of insulating posts 380. The area of alternation of conductive pads 34 and of insulating posts 380 defines the assembly site 31 of electronic circuit 30. Thus, the second portion 304B of the conductive layer extends on either side of assembly site 31 and fills an area 39 said to be peripheral to said assembly site.

Figure 3D:
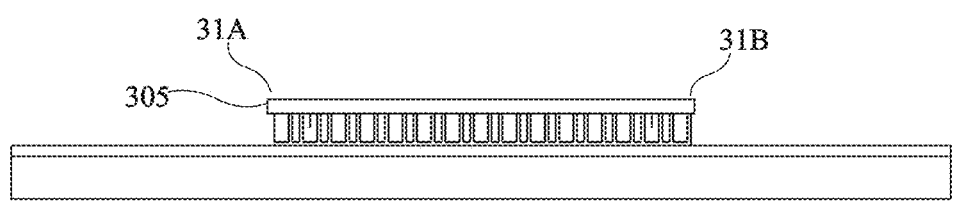

There is then performed, as illustrated in FIG. 3D, the removal of this second portion 304B of the conductive layer, as well as of another portion 302B of barrier layer 302 located under said second portion of the conductive layer.

It is for this purpose performed an etching through a complementary resin pattern 305 (second etching mask) formed on the upper surface 31S of assembly site 31. The complementary pattern is for example free of holes. The complementary pattern is for example formed by photolithography.

Complementary pattern 305 totally covers assembly site 31. According to an advantageous embodiment, and as shown in FIG. 3D, complementary pattern 305 may slightly further extend, by a dimension for example in the range from approximately 1 nm to 1 μm, for example, approximately 300 nm, beyond the upper surface 31S of assembly site 31.

This extension enables to avoid that, during one and/or the other of the two next etch steps, the insulating posts 380 located on the edges 31A, 31B of assembly site 31 to also be submitted to an etching, even partial.

The etching of the second portion 304B of the conductive layer is preferably a wet etching, for example by means of a solution formed of a mixture of sulfuric acid ($H_2SO_4$) and of hydrogen peroxide ($H_2O_2$).

The etching of portion 302B of diffusion barrier 302 may be a dry etching, particularly implementing a plasma, or a wet etching, particularly by means of a solution of "SC1" type comprising ammonia and hydrogen peroxide.

Figure 3E:
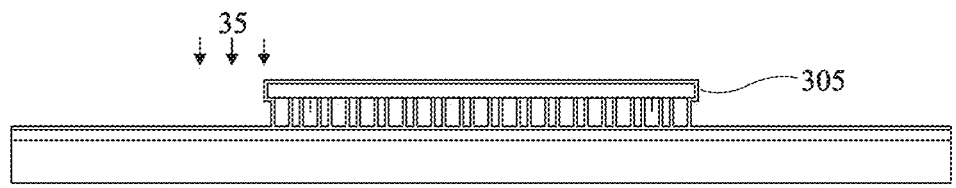

FIG. 3E illustrates a subsequent optional step of forming a layer 35 made of a hydrophobic material ("hydrophobic layer"). This hydrophobic layer enables to increase the wettability difference between assembly site 31 and the peripheral area 39 surrounding it. Layer 35 of hydrophobic material may be deposited by spin coating or by a vapor phase deposition technique. Its thickness is typically in the range from approximately 1 nm to 300 nm.

The hydrophobic material may be a fluorinated material, preferably fluorocarbon. As an example, the hydrophobic material is based on fluorocarbon compounds of $C_xF_y$ type, where x and y are real numbers, x may vary from 1 to 5 and y may vary from 1 to 8.

Figure 3F:
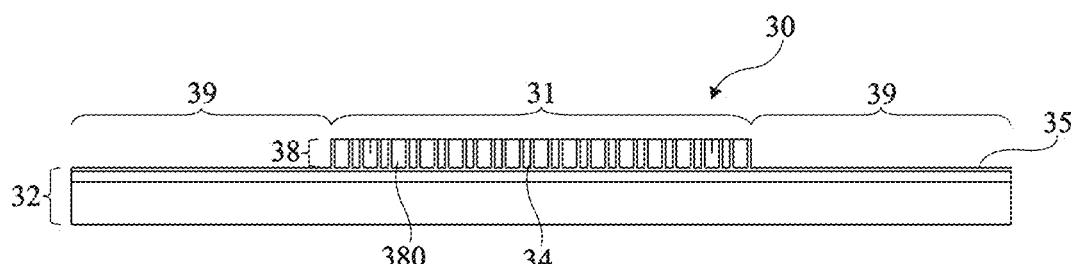

FIG. 3F illustrates the electronic circuit 30 obtained after removal of complementary pattern 305.

In the case where a step of forming a layer of hydrophobic material has been carried out, this step also enables to remove the portion of the hydrophobic layer formed on said complementary pattern, according to an effect called "lift-off".

The obtained electronic circuit 30 exhibits an assembly site 31 on support 32, the assembly site comprising conductive pads 34 extending substantially vertically in the assembly site, two adjacent conductive pads being insulated from each other by an insulating post 380. Assembly site 31 is adapted to be assembled to another electronic circuit by a self-assembly method including a hybrid bonding step, for example, a step of hybrid molecular bonding or by thermocompression.

Optionally, the peripheral area 39 of support 32 surrounding assembly site 31 is coated with a hydrophobic layer 35, to decrease its wettability with respect to assembly site 31 and favor the confinement of a liquid drop on the assembly site. Other solutions may be implemented to increase this wettability difference. The hydrophily of the assembly surface may for example be increased by an adapted surface treatment, for example by means of a UV/ozone plasma.

Figure 3G:
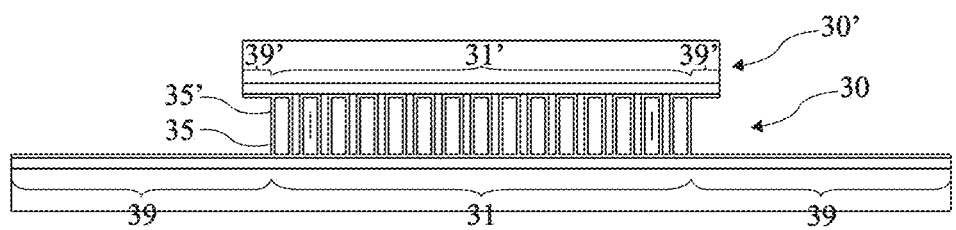
FIG. 3G is a cross-section view illustrating a method of self-assembly of two electronic circuits obtained by the manufacturing method of FIGS. 3A to 3F.

FIG. 3G is a cross-section view illustrating a method of self-assembly of a first electronic circuit 30 and of a second electronic circuit 30', said electronic circuits being obtained by a manufacturing method according to the example described in relation with FIGS. 3A to 3F. They may as a variant be for one and/or the other obtained by another method described hereafter. As shown, second electronic circuit 30' may be diced, for example, to form a die, before being assembled to first electronic circuit 30.

The steps of the self-assembly method are not illustrated, but they typically comprise:
  a step of deposition of a drop of a liquid, for example, a water drop, on the assembly site 31 of first electronic circuit 30;
  a step where the second electronic circuit 30' is brought towards the assembly site 31 of first electronic circuit 30 until its assembly site 31' comes into contact with the drop;
  then, once electronic circuit 30' is aligned on first electronic circuit 30:
  a step of hybrid bonding of second electronic circuit 30' to first electronic circuit 30 after evaporation of the liquid, the bonding being performed preferably by hybrid molecular bonding or by thermocompression.

It is possible, after bonding, to remove the hydrophobic layer 35, 35' formed on each peripheral area, for example by a dry etching.

The manufacturing method, by defining in a single photolithography step the edges of the assembly site and the locations of the conductive pads in said site, enables to ensure a very good alignment both of the assembly sites and of the conductive pads between two electronic circuits manufactured according to said manufacturing method.

Figure 3H:
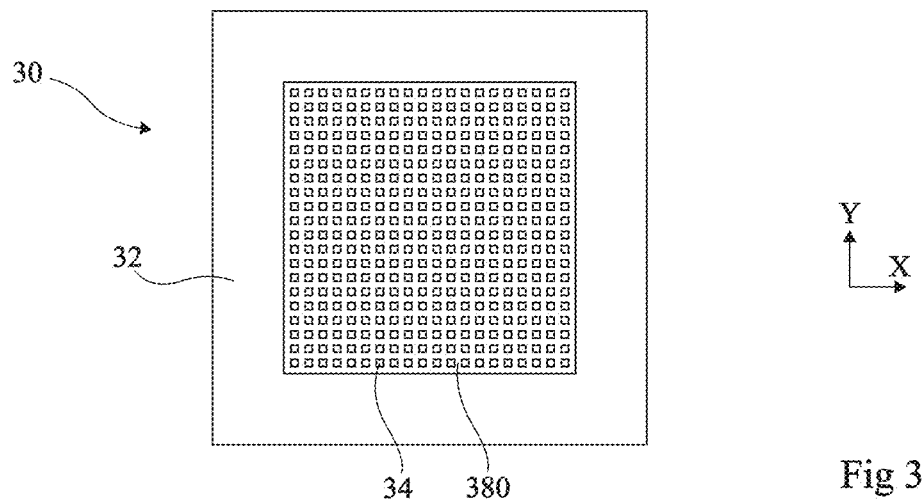
FIG. 3H is a top view of the electronic circuit obtained by the method of FIGS. 3A to 3F.

It should be noted that, in all the drawings which are cross-section views, the edges of the assembly site are shown along the X direction but obviously, the edges are also in the Y direction of the main plane XY of the electronic circuit. The electronic circuit may have a structure substantially symmetrical in both directions of the plane, as shown in FIG. 3H, where there can be seen in top view insulating posts 380, conductive pads 34, and the support 32 around.

Figure 4A:
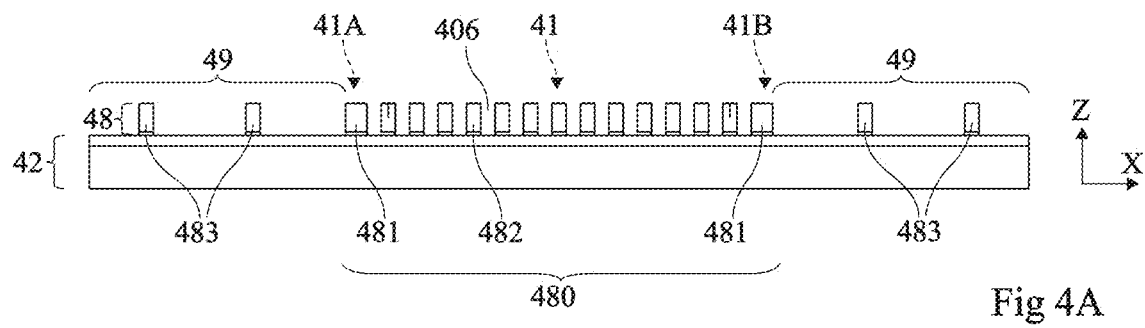
FIG. 4A, FIG. 4B, and FIG. 4C are cross-section views illustrating a method of manufacturing an electronic circuit according to another embodiment.
Figure 4B:
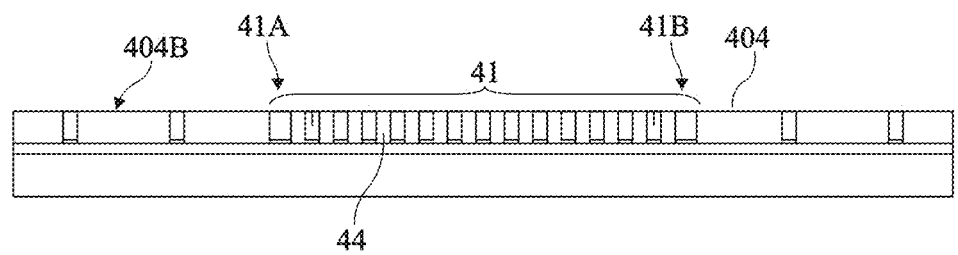
Figure 4C:
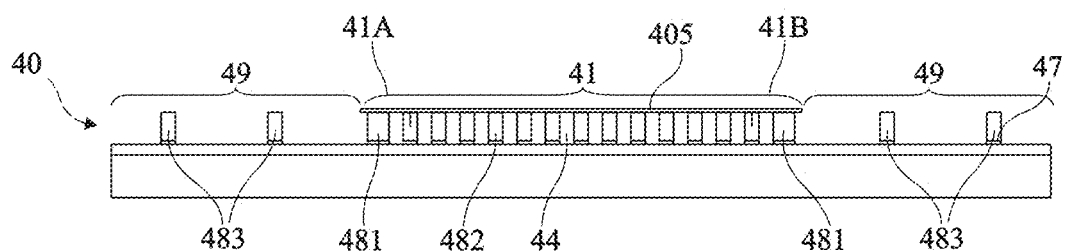

FIGS. 4A to 4C are cross-section views illustrating a method according to another embodiment. As illustrated in FIG. 4A, this example differs from the previous method in that:
  insulating posts 480 comprise insulating posts 481 located on edges 41A, 41B of assembly site 41 having a greater width than the insulating posts 482 located between said edges; and/or
  complementary posts 483 made of a dielectric material are also formed in the peripheral area 49 surrounding assembly site 41 of same dimension as insulating posts 482 or of greater dimensions.

The other steps of the manufacturing method are similar to those described in relation with FIGS. 3A to 3F.

As illustrated in FIG. 4B illustrating the structure obtained at the end of the polishing step, the presence of complementary posts 483 made of a dielectric material enables to limit, or even to avoid, the phenomenon of dishing of the second portion 404B of the conductive layer extending on either side of assembly site 41, which phenomenon may occur during the step of polishing on copper areas having too large dimensions, and which may induce a poor definition of the edges of the assembly site. Further, the change in copper density between the assembly site and the peripheral area may cause a dishing also at the level of the conductive pads at the edge of the assembly site, likely to cause a poor contact at the time of the assembly and a lack of bonding during the bonding step. The presence of complementary posts 483 as well as of the insulating posts 481 located on edges 41A, 41B of assembly site 41 having a greater width than the insulating posts 482 located between said edges will enable to limit, or even to suppress, this phenomenon.

As illustrated in FIG. 4C, after etching of the second portion 404B of the conductive layer, complementary posts 483 remain present in the peripheral area 49 surrounding assembly site 41. It is possible at this stage either to keep them, or to remove them.

Complementary posts 483 may indeed be removed by lift-off effect by a wet etching of etch stop layer 47. During such an etch step, the portions of the etch stop layer located on edges 41A, 41B of assembly site 41 and/or end posts 481 may undergo an at least partial etching. It is thus advantageous, to overcome this problem, for end posts 481 to have a greater width than central posts 482.

Figure 5:
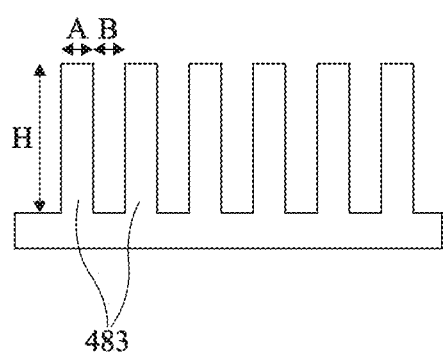
FIG. 5 shows a variant of the manufacturing method of FIGS. 4A to 4C.

As a variant, complementary posts 483 may be kept and used to increase the wettability difference between the assembly site and the peripheral area (as a complement or as an alternative to a layer of hydrophobic material deposited on the peripheral area). For this purpose, complementary posts 483 must be formed to respect given ranges of dimensions and of spacings between two adjacent complementary posts, as illustrated in FIG. 5. The resin pattern is then defined to respect these ranges of dimensions and spacings, and the thickness of the dielectric material is also defined to respect a defined height of the complementary posts. Preferably, the height H of complementary posts 483 is in the range from approximately 50 nm to 2 μm the width A of the complementary pads is in the range from approximately 0.5 μm to 1 μm and spacing B between two adjacent complementary pads is in the range from approximately 0.5 μm to 2 μm.

After the removal of complementary pattern 405, electronic circuit 40 is obtained.

The self-assembly method described in relation with FIG. 3G may apply to first and second electronic circuits obtained by this other example of manufacturing method.

Figure 6A:
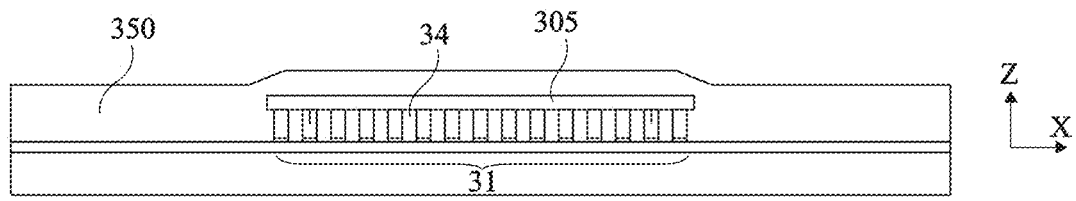
FIG. 6A and FIG. 6B are cross-section views illustrating a method of manufacturing an electronic circuit according to another embodiment.
Figure 6B:
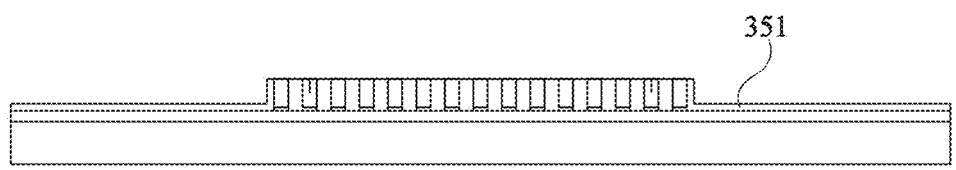

FIGS. 6A and 6B are cross-section views illustrating another embodiment which differs from the method described in relation with FIGS. 3A to 3F mainly by the steps of forming layer 35 of hydrophobic material and of removal of complementary resin pattern 305. It is thus started from the structure obtained in FIG. 3D.

As illustrated in FIG. 6A, a layer 350 of hydrophobic material is formed on this structure. Conversely to the previous embodiment, this hydrophobic layer 350 has a thickness greater than that of the protrusion of assembly site 31 so as to cover it.

Hydrophobic layer 350 typically has a thickness in the range from approximately 300 nm to 3 μm. It may be formed according to techniques similar to those described in relation with the hydrophobic layer 35 of FIG. 3E and may be made of the same materials.

The step of removal of the complementary resin pattern 305 forming the structure illustrated in FIG. 6B is preferably carried out by implementing a dry etching, preferably at least partially selective over the conductive material of conductive pads 34, possibly followed by a step of liquid chemistry to remove resist residues. Such a removal step is implemented to etch both the hydrophobic material and the resin. The dry etching may be an etching implementing a plasma, particularly a plasma based on nitrogen and hydrogen ($N_2/H_2$).

At the end of this step of removal of complementary pattern 305, the thickness of hydrophobic layer 351 is decreased, for example in the range from approximately 100 to 400 nm, advantageously from approximately 10 nm to 40 nm.

The obtained electronic circuit 30, illustrated in FIG. 6B, is substantially similar to the electronic circuit illustrated in FIG. 3F.

This other manufacturing method enables to ensure that a sufficient layer of hydrophobic material is formed over the entire peripheral area 39 surrounding assembly site 31, including on the lateral edges of assembly site 31, and this, despite the presence of the extension of complementary resin pattern 305. Further, such a thickness of hydrophobic material enables to have a greater margin on the consumption thereof during the different steps of the method which are likely to degrade it. A plurality of surface treatments may thus be combined or longer treatment times may be applied, particularly to increase the wettability of the assembly site.

FIGS. 7A to 7D are cross-section views illustrating another embodiment. It differs from the previous methods in that it enables to form an assembly site in a plurality of levels. This enables to increase the height of the assembly site and favor the confinement of a liquid drop on said site during the self-assembly of two electronic circuits.

It is started for this example from the structure obtained in FIG. 4B (illustrated mode) or 3C (non-illustrated mode). A support 52 and a first level 53 of assembly site 511 on support 52 are thus available, said first level having a substantially planar surface, said assembly site 511 of first level 53 comprising first conductive pads 54 (originating from a first conductive layer 504) arranged between first insulating posts 581, 582 and forming the first level of assembly site 51. First complementary posts 583 made of a dielectric material are for example arranged in the peripheral area 59 of the assembly site.

Figure 7A:
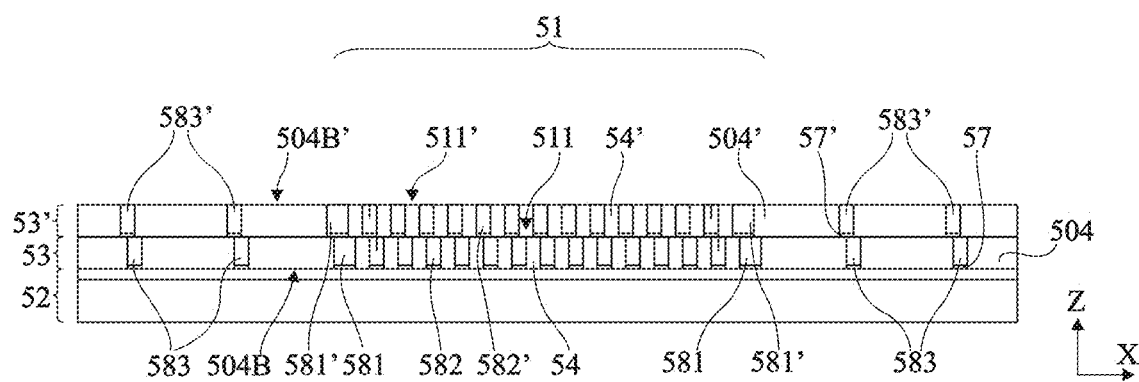
FIG. 7A, FIG. 7B, FIG. 7C, and FIG. 7D are cross-section views illustrating a method of manufacturing an electronic circuit according to another embodiment.

As illustrated in FIG. 7A, a second etch stop layer 57' is arranged on the structure. The method described in relation with FIG. 3A to 3C or 4A and 4B is then repeated to form on stop layer 57' a second level 53' of assembly site 511', said second level having a substantially planar surface, said assembly site 511' of the second level 53' comprising the second conductive pads 54' (originating from a second conductive layer 504') arranged between second insulating posts 582', 581', the second conductive pads 54' and the second insulating posts 581', 582' being located respectively substantially vertically in line with first conductive pads 54 and with first insulating posts 581, 582. The assembly site 511' of second level 53' forms the second level of assembly site 51. Second complementary posts 583' made of a dielectric material are for example arranged in the peripheral area 59 of the assembly site, substantially vertically in line with the first complementary posts.

Figure 7B:
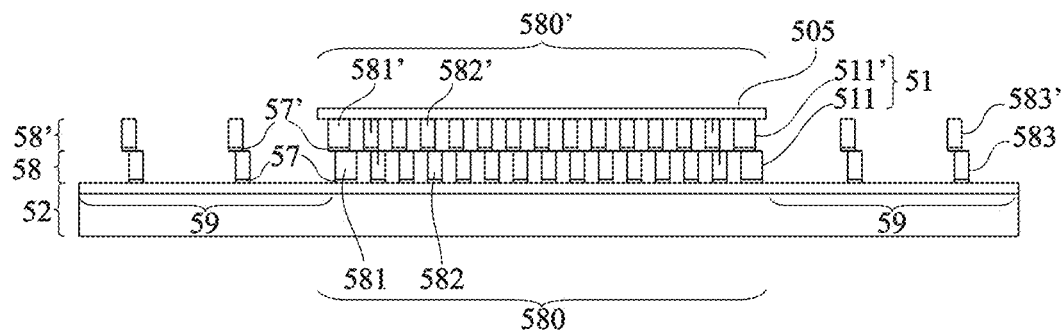

FIG. 7B illustrates the forming of a complementary resin pattern 505 on the second level 511' of assembly site 51. This pattern will be used as a mask for the etching of the second portion 504B' of second conductive layer 504' and of a portion of a second barrier layer (not shown) as well as the second portion 504B of first conductive layer 504 and of a portion of a first barrier layer (not shown) to emerge into support 52.

It is possible at this stage possibly to remove complementary posts 583, 583' and/or to form a layer made of a hydrophobic material on the structure.

Figure 7C:
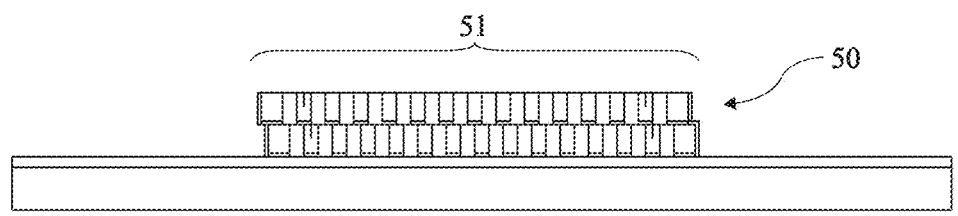

As illustrated in FIG. 7C, at the end of the step of removal of complementary pattern 505, an electronic circuit 50 comprising a two-level assembly site 51 on a support 52 is obtained.

Figure 7D:
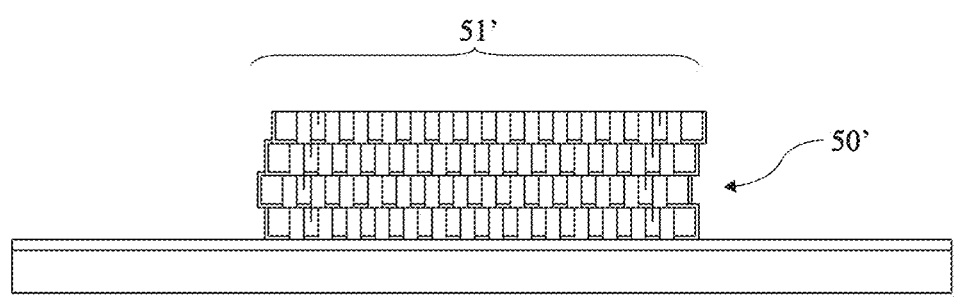

All the steps described in relation with FIG. 7A may be repeated, as many times as necessary, before implementing the steps described in relation with FIG. 7B, to obtain an electronic circuit 50' with an assembly site 51' having more than two levels, as illustrated in FIG. 7D.

According to alternative embodiments, the steps of this other example of manufacturing method may be adapted to integrate variants of the previous examples.

FIGS. 8A to 8D are cross-section views illustrating a manufacturing method according to another embodiment also implementing a damascene-type method, which mainly differs from the previously-described examples in that the assembly site, including the conductive pads, is formed not by etching of an insulating layer but by etching of a conductive layer, the steps of the manufacturing method being accordingly adapted.

This other example of manufacturing method is particularly adapted to forming conductive pads made of aluminum (Al), but it may also be implemented to form pads made of another metal, for example, of titanium (Ti) or of tungsten (W), or of a metal alloy, for example, an alloy based on aluminum and copper (AlCu), or of an alloy of aluminum and silicon (AlSi).

The initial structure comprises a support 62 comprising a substrate 621 coated with an initial layer made of a dielectric material 622. Support 62 is coated with an etch stop layer 67, itself coated with a conductive layer 604, for example, a layer made of a metallic material. The substrate is for example made of silicon (Si). The dielectric material is for example made of silicon dioxide ($SiO_2$). The etch stop layer is for example made of silicon nitride ($Si_xN_y$). The conductive layer may be deposited by a chemical vapor deposition technique, particularly by a plasma-enhanced chemical vapor deposition technique (PECVD). It is for example made of aluminum. Its thickness is for example in the range from 50 nm to 2 μm, for example, equal to 500 nm.

Figure 8A:
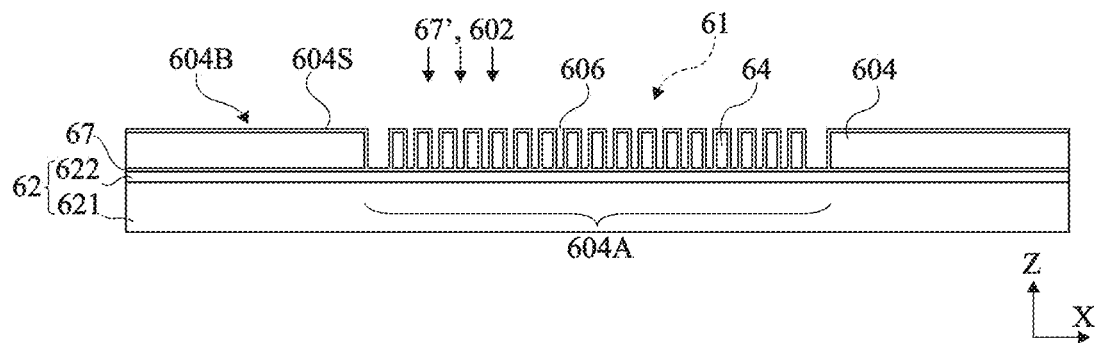
FIG. 8A, FIG. 8B, FIG. 8C, and FIG. 8D are cross-section views illustrating a method of manufacturing an electronic circuit according to another embodiment.

As illustrated in FIG. 8A, conductive layer 604 is then structured, by using a pattern (or third etching mask, not illustrated) formed of a succession of solid square blocks separated by holes, in this example formed by photolithography, and then by etching said conductive layer through said pattern, to form trenches 606 in said conductive layer.

The etching of the conductive layer may be a dry or wet etching, for example, an etching using an iron chloride solution ($FeCl_3$) in the case of the etching of aluminum.

Thus, the central portion 604A (first portion) of the conductive layer is shaped in a plurality of conductive pads 64 between two trenches 606, and the peripheral portion 604B (second portion) of the conductive layer is not etched.

The plurality of trenches 606 defines the contours of the future assembly site 61 of electronic circuit 60 and trenches 606 define the locations of the future insulating posts between two conductive pads 64, as further described hereafter.

Thus, the edges of the assembly site and the locations of the conductive pads are defined during this photolithography step, that is, with a same photolithography level.

One then arranges on the structure:
- a complementary etch stop layer 67', for example made of silicon nitride ($Si_xN_y$), formed on conductive pads 64, on the peripheral portion 604B of the conductive layer, and in trenches 606; and
- a barrier layer 602 formed on complementary etch stop layer 67'.

Barrier layer 602 for example comprises a material adapted to blocking the diffusion of the conductive material in the dielectric material that will then be deposited. It is for example made of titanium nitride (TiN), possibly of a bilayer with titanium (TiN/Ti) or of a bilayer of tantalum nitride and tantalum (TaN/Ta).

Figure 8B:
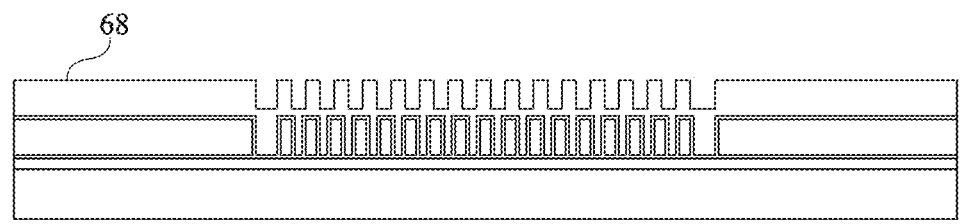

FIG. 8B illustrates the forming of a layer made of a dielectric material 68 (insulating layer) on barrier layer 602, especially to fill trenches 606. The dielectric material is for example made of silicon dioxide ($SiO_2$). The insulating layer may be deposited by chemical vapor deposition, particularly by PECVD. Its thickness must be higher than (or equal to) the depth of trenches 606 to fill them, it is for example in the range from approximately 50 nm to 3 μm, for example, equal to approximately 1 μm.

Figure 8C:
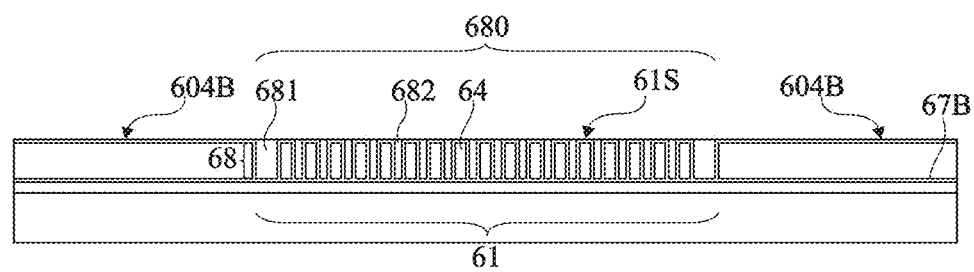

FIG. 8C illustrates the structure obtained at the end of a subsequent polishing step enabling to remove an excess portion of insulating layer 68 to define a planar surface where the dielectric material 68 in trenches 606 is flush with and at the same level as conductive pads 64. The polishing step for example consists of a chemical-mechanical polishing (CMP).

At the end of the polishing step, the obtained structure comprises an alternation of conductive pads 64 and of insulating posts 680, defining the assembly site 61 of electronic circuit 60, where conductive pads 64 and insulating posts 680 may respectively have equal or different dimensions with respect to one another.

Figure 8D:
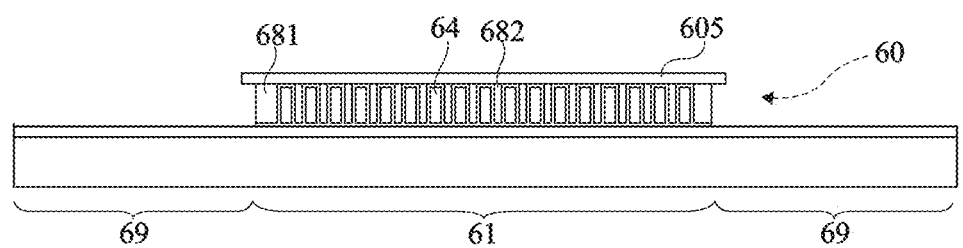

As illustrated in FIG. 8D, there is then performed the removal of the peripheral portion 604B of the conductive layer located on either side of assembly site 61 as well as of the residual portion 67B of first etch stop layer 67 located under this peripheral portion 604B. This removal is performed by etching through a complementary resin pattern 605 formed on the upper surface 61S of assembly site 61, for example, by photolithography.

As previously described, complementary pattern 605 entirely covers assembly site 61, or even it may slightly extend beyond the upper surface 61S of assembly site 61.

The etching of the peripheral portion 604B of the conductive layer is preferably a wet etching, for example implementing a chemical solution formed of phosphoric acid ($H_3PO_4$), of acetic acid, of nitric acid ($HNO_3$), and of water ($H_2O$).

The etching of the residual portion 67B of first etch stop layer 67 may be a wet etching, particularly by means of a chemical solution based on phosphoric acid ($H_3PO_4$).

The manufacturing method may comprise variants described in relation with the other methods (forming of a hydrophobic layer and/or of complementary pads in the peripheral area, assembly site with a plurality of levels . . . ).

The obtained electronic circuit 60 exhibits a support 62 and an assembly site 61 on the support, assembly site 61 comprising conductive pads 64 extending substantially vertically in the assembly site, two adjacent conductive pads being insulated by two insulating posts 680. Assembly site 61 is adapted to being assembled to another electronic circuit by a self-assembly method including a hybrid bonding step. The peripheral area 69 of support 62 surrounding the assembly site 61 of electronic circuit 60 may be coated with a layer of hydrophobic material and/or comprise complementary pads.

For all the examples of embodiment, and more generally for an electronic circuit obtained by a manufacturing method according to an embodiment, the following dimensions may be within the following ranges:
- height of the insulating posts (or heights of the conductive pads): from 50 nm to 2 μm;
- widths of the insulating posts: from 10 nm to 100 μm;
- widths of the conductive pads: from 10 nm to 100 μm;
- thickness of the layer of hydrophobic material: from 1 nm to 2 μm.

For all the examples of embodiment:
- the step (or the steps) of forming the etch stop layer(s) may be omitted; or
- the (first) etch stop layer may be formed between the substrate and the initial insulating layer; or
- the (first) etch stop layer may be formed on a level of the substrate, for example, between two substrate layers.

More generally, an etch stop layer may be arranged at a level corresponding to the desired etch depth.

In certain cases, the initial insulating layer may be omitted and/or the initial insulating layer and the (first) insulating layer may be a single insulating layer (monolayer or multilayer structure).

Further, for methods similar to the manufacturing methods described in relation with FIGS. 3 to 7, the step of etching of the insulating layer may comprise or be followed by the etching of the initial insulating layer and/or by the etching of the substrate down to a given depth. Similarly, for methods similar to the manufacturing method described in relation with FIGS. 8, the conductive layer etching step may comprise or be followed by the etching of the initial insulating layer and/or by the etching of at least a portion of the substrate. This is advantageous when a more significant assembly site height is desired, particularly greater than 500 µm.

There appears from all the embodiments, examples, and variants that the manufacturing method, by defining the edges of the assembly site and the locations (including dimensions in at least one direction of the main plane) of the conductive pads with a same pattern, for example, in a same photolithography level, enables to avoid the risk of misalignment which exists when two patterns, for example two photolithography patterns, are implemented to draw on the one hand the locations of the conductive pads and on the other hand the edges of the assembly site. Thus, a very good alignment both of the assembly sites and of the conductive pads is ensured between two electronic circuits. Further, this enables to simplify the forming of the assembly site. Further, the method is easily adaptable, according to the desired electronic circuits, in particular according to the desired configurations of the assembly sites and/or of the areas peripheral to said sites, which may be simply implementable by adapting the shape and the dimensions of the pattern (or of the patterns when there is a plurality of assembly site levels).

Various embodiments and variants have been described. Those skilled in the art will understand that certain features of these various embodiments and variants may be combined, and other variants will occur to those skilled in the art. In particular:
- the electronic circuit may comprise on the plane of its support a plurality of assembly sites, particularly when a plurality of other electronic circuits must be assembled to the electronic circuit;
- the marks in the insulating layer between conductive pads may be omitted.

The invention claimed is:

1. A method of manufacturing an electronic circuit extending along a main plane, the manufacturing method comprising:
   a) a step of forming, by a damascene method by means of a pattern, an assembly site on a support, the assembly site being formed of an alternation of conductive pads made of a conductive material and of insulating posts made of a dielectric material flush with a first surface of the assembly site, the assembly site being delimited by insulating posts and surrounded with a peripheral area comprising a portion of the conductive material;
   b) a step of forming a second etching mask entirely covering the assembly site;
   c) a complementary step of etching, through the second etching mask, of the conductive material of the peripheral area, then a step of removal of the second etching mask, so that the assembly site forms a protrusion with respect to the support; and
   d) assembling the assembly site of the electronic circuit using a self-assembly method including a hybrid bonding step to another assembly site of another electronic circuit manufactured according to steps a), b), and c).

2. The manufacturing method according to claim 1, wherein the step of forming by a damascene method of the assembly site comprises:
   a step of forming an insulating layer made of the dielectric material on the support;
   a step of etching the insulating layer through a first resin etching mask forming the pattern comprising solid portions separated by holes in order to form the insulating posts made of the dielectric material separated by trenches in said insulating layer; then
   a step of removal of the pattern; a step of forming a conductive layer made of the conductive material on the etched surface of the insulating layer to fill the trenches, and to cover the insulating posts, the conductive material inserted into the trenches forming the conductive pads alternating with the insulating posts; then
   a step of polishing the conductive layer such that the conductive pads and the insulating posts are flush with each other at the same level.

3. The manufacturing method according to claim 2, wherein the conductive material is copper.

4. The manufacturing method according to claim 1, wherein the step of forming by a damascene method of the assembly site comprises:
   a step of forming a conductive layer made of the conductive material on the support;
   a step of etching the conductive layer through a third resin etching mask forming the pattern and comprising solid portions separated by holes to form the conductive pads made of the conductive material separated by trenches; then a step of removal of the third etching mask;
   a step of forming an insulating layer made of the dielectric material on the etched surface of the conductive layer to fill the trenches, and to cover the conductive pads, the dielectric material inserted into the trenches forming the insulating posts insulating the conductive pads from one another; then
   a step of polishing of the insulating layer such that the conductive pads and the insulating posts are flush with each other at the same level.

5. The manufacturing method according to claim 4, wherein the conductive material is aluminum, tungsten, or an alloy based on aluminum and copper or on aluminum and silicon.

6. The manufacturing method according to claim 2, wherein the forming the assembly site comprises, prior to the step of forming the insulating layer on the support or the conductive layer on the support, a step of forming an etch stop layer on the support.

7. The manufacturing method according to claim 1, wherein the pattern is sized so that the insulating posts comprise insulating posts at the edges of the assembly site wider in at least one direction of the main plane than the insulating posts located between said edges.

8. The manufacturing method according to claim 1, wherein the pattern is sized to form, on the peripheral area of the support, complementary posts made of the dielectric material.

9. The manufacturing method according to claim 8, wherein the complementary posts are configured to decrease the wettability of the peripheral area with respect to the wettability of the assembly site.

10. The manufacturing method according to claim 1, wherein the steps of forming, by a damascene method, the assembly site are repeated at least once, before the step of forming of the second etching mask, to form another assembly site level comprising other conductive pads and other insulating posts, said other conductive pads, respectively said other insulating posts, being arranged substantially vertically in line with the conductive pads, respectively with the insulating posts, of the previously-formed level of the assembly site.

11. The manufacturing method according to claim 1, wherein the second etching mask further extends by a dimension in the range from 1 nm to 1 μm on either side of the assembly site above the peripheral area.

12. The manufacturing method according to claim 1, comprising a step, subsequent to the complementary etching step, of forming a layer having a thickness in the range from 1 to 300 nm, made of a hydrophobic material, on the peripheral area, the hydrophobic material being a fluorinated material comprising fluorocarbon.

13. The manufacturing method according to claim 2, wherein the conductive material is cobalt.

14. The manufacturing method according to claim 9, wherein the complementary posts have a width in at least one direction of the main plane in the range from 0.5 μm to 1 μm, a height in the range from 50 nm to 2 μm, and two adjacent complementary posts are distant by a spacing in the range from 0.5 μm to 2 μm in said direction.

15. The manufacturing method according to claim 10, further comprising an earlier step of forming an etch stop layer on the previously-formed level of the assembly site.

\* \* \* \* \*